(12) United States Patent
Takaishi

(10) Patent No.: US 6,541,827 B1
(45) Date of Patent: Apr. 1, 2003

(54) SEMICONDUCTOR DEVICE HAVING A PATTERNED INSULATED GATE

(75) Inventor: Masaru Takaishi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/481,570

(22) Filed: Jan. 11, 2000

(30) Foreign Application Priority Data

Jan. 14, 1999 (JP) .......................................... 11-008302

(51) Int. Cl.$^7$ ........................ H01L 29/94; H01L 31/113
(52) U.S. Cl. ...................................... 257/390; 257/296
(58) Field of Search ................................ 257/339, 340, 257/341, 342, 390, 327, 296, 565; 438/587, FOR 208

(56) References Cited

U.S. PATENT DOCUMENTS

| | | | |
|---|---|---|---|
| 5,136,349 A | * 8/1992 | Yilmaz et al. | 357/23.4 |
| 5,164,802 A | * 11/1992 | Jones et al. | 257/337 |
| 5,323,036 A | * 6/1994 | Neilson et al. | 257/287 |
| 5,504,360 A | * 4/1996 | Tokura et al. | 257/342 |
| 6,104,060 A | * 8/2000 | Hshieh et al. | 257/329 |
| 6,346,727 B1 | * 2/2002 | Ohtomo | 257/341 |

* cited by examiner

Primary Examiner—Steven Loke
Assistant Examiner—Douglas W. Owens
(74) Attorney, Agent, or Firm—Arent Fox Kintner Plotkin & Kahn

(57) ABSTRACT

An n-type semiconductor layer, for example, is provided to be a drain region (1). A plurality of p-type diffusion regions (body regions) are formed regularly on the surface of the semiconductor layer. And an n-type diffusion region is formed, as a source (3), on the surface of each of the plurality of p-type body regions (2), so that a channel region (8) is formed in a part between the source and the drain regions for a transistor cell. On the surface of the transistor cells, provided is a gate electrode (5) via an insulator film (4), and this gate electrode is patterned in a certain shape by removing portions above where adjoining three or four of said cells are bordering on each other without including any part of said channel regions (8). Those portions are referred to as removed portions (10). As a result, an insulated gate type semiconductor device is gained, wherein an equal voltage can be applied to the gate of each cell while achieving a quick switching speed by reducing the gate capacitance and preventing the gate resistance from increasing.

3 Claims, 3 Drawing Sheets

SEMICONDUCTOR DEVICE HAVING A PATTERNED INSULATED GATE

FIELD OF THE INVENTION

The present invention relates to an insulated gate type semiconductor device such as a vertical MOSFET or an insulated gate bipolar transistor (IGBT), more particularly, to an insulated gate type semiconductor device of which switching time can be shorter by having a smaller gate capacitance without increasing the gate line resistance.

BACKGROUND OF THE INVENTION

A conventional vertical diffusion MOSFET (VMOSFET) has, for example, a structure as shown in FIG. 4(a). That is to say, an epitaxial layer is grown on, for example, an n$^+$-type semiconductor substrate 21a to be an n-type semiconductor layer (an epitaxial growth layer) 21, which will later work as a drain region. On the surface of the epitaxial growth layer 21, a p-type impurity is diffused to form a p-type body region (a cell) 22. On the surface of the body region 22, an n$^+$-type source region 23 is formed. A gate electrode 25 is provided above the edge of the body region 22 and part of the semiconductor layer 21 outside the edge through gate oxide 24 intervened in-between. And a source electrode 26 is formed from aluminum or the like in contact with the source region 23, and a drain electrode 27 is formed on the backside of the semiconductor substrate 21a, so that the edge of the body region 22 becomes a channel region 28 between the drain region (the semiconductor layer) 21 and the source region 23, with a gate electrode 25 provided on top through the gate oxide 24, which controls a transistor constructed of them to be turned on and off.

FIG. 4(a) is a section view of a portion (one transistor cell) of a device where channel regions 28 are formed around outside of the source regions 23, which in turn formed around one body region 22. Actually, however, this body region 22 is an element of a matrix, which is partially shown in a plan view illustrated in FIG. 4(b). In the matrix, many transistor cells are formed to construct a power MOSFET for dealing with a heavy current.

FIG. 4(b) is a plan view of a portion of a device condition where the gate electrode 25 is provided before the source electrode 26 is provided. As shown in FIG. 4(b), the gate electrode 25 is provided on the entire surface surrounding the p-type body regions 22. In case the gate electrode 25 is provided on the entire surface except for contact parts of the source electrodes 26 in this manner, an input capacitor C$_{iss}$ and a feedback capacitor C$_{rss}$ are formed between the gate electrode 25 and the drain region (the semiconductor layer) 21, causing a problem that the switching time is long when a switching operation is carried out.

To reduce such a gate capacitance, an idea is conceived that part of the gate electrode over the drain region is removed. For example, in the Japanese Unexamined Patent Publication No. 6-318705 (1994), a method for reducing the input capacitance is disclosed wherein, the gate electrode is formed and remained only above the channel regions while the rest part is completely removed, or as shown in FIG. 5, in review of the difficulty with forming gates only above the channel regions precisely, the gate electrode is partially removed between rows of cells 22 in array to form stripes 30 so that the gate electrode which faces the drain region is decreased to 22–70%.

As described above, from the point of view of only reducing the capacitance between the gate electrode and drain region, the capacitance can be reduced by removing part of the gate electrode. When the electrode is removed in stripes as shown in FIG. 5, however, there occurs a problem that part of the gate electrode for each cell can not be supplied with an equal voltage because of a serial resistance increased by the electrical connections to a part of the gate electrode for each cell from either end of each row of cells in array, since the gate electrode for a plurality of transistor cells adjoining each other is separated line by line.

SUMMARY OF THE INVENTION

The present invention is to solve the above mentioned problems, hence, it is a purpose of the invention to provide an insulated gate type semiconductor device wherein the gate of each transistor cell can be supplied with an equal voltage, and a quick switching speed is gained by reducing the gate capacitance while prevention an increase of the gate resistance.

An insulated gate type semiconductor device according to the present invention comprises:

a plurality of transistor cells, each of which comprising; a first conductivity type semiconductor layer, a body region comprising a second conductivity type diffusion region provided on the surface of the semiconductor layer, a first conductivity type diffusion region formed on the surface of the body region, a channel region formed on the surface of the body region between the first conductivity type diffusion region and the first conductivity type semiconductor layer; the plurality of transistor cells being formed regularly in the first conductivity type semiconductor layer; and a gate electrode provided on the surface of the semiconductor layer through an insulator film so as to cover at least the surface of the channel regions; the gate electrode being patterned to have a certain shape by removing portions above where adjoining three or four of the transistor cells are bordering on each other via a point without including any part of the channel regions.

The portion where adjoining three or four of the transistor cells are bordering on each other via a point means a point of meeting of three or four transistor cells, that is, in case the transistor cells are formed by arranging them in a matrix, the adjoining four transistor cells are bordering on each other through a point where all of the four corners meet, in case the cells are arranged in array, every other row of which is shifted by half a pitch, as shown in FIG. 3, adjoining three of the transistor cells are bordering on each other through a point where all of the three angles meet in case the transistor cells are a hexagon, and adjoining three of the transistor cells are bordering on each other through a point where two angles meet on one side in case the transistor cells are quadrilateral. A shape of the transistor cells are determined in accordance with the shape of the body regions so that each of the body region are spaced equally.

By having this structure, the gate electrode is removed in portions which are away from the channel regions of the transistor cells, therefore, it is easy to arrange the removed portions of the gate electrode so that each of them is not overlapped with any part of the channel regions. And parts of the gate electrode for the respective transistor cells are connected to each other to form the gate electrode, so that nothing interferes with the signal supplied to the gate electrode covering each of the channel regions for the transistor cells, and the voltage is supplied to the gate electrode for each of the transistor cells with a low resistance. On the other hand, the capacitance between the gate electrode and the drain region is lowered by the eliminated area of the gate electrode, which can maintain the switching speed very fast.

More concretely, the plurality of transistor cells are arranged in array, every other row of which is shifted by half a pitch from the adjacent row, the body regions and the transistor cells form a quadrilateral or a hexagon on the surface (on a plane form), and the gate electrode is removed in portions above where adjoining three of the transistor cells are bordering on each other, or the plurality of transistor cells are arranged in a matrix, the body regions and the transistor cells form a quadrilateral on the surface(on a plane form), and the gate electrode is removed in portions above where adjoining four of the transistor cells are bordering on each other. By those structures, a high speed of switching can be achieved without increasing the gate resistance and by reducing the capacitance between the gate electrode and the drain region. Though the shapes of the body regions or the transistor cells on the surface are described as a quadrilateral or a hexagon, they include the shapes where the corners of those are rounded or altered to have arcs instead of angles. A shape of the removed parts in the plane could be a triangle (including a shape with rounded vertexes or with chamfered vertexes or the like, same in the following) and other polygons as well as a circle.

DETAILED DESCRIPTION

Figure 1:
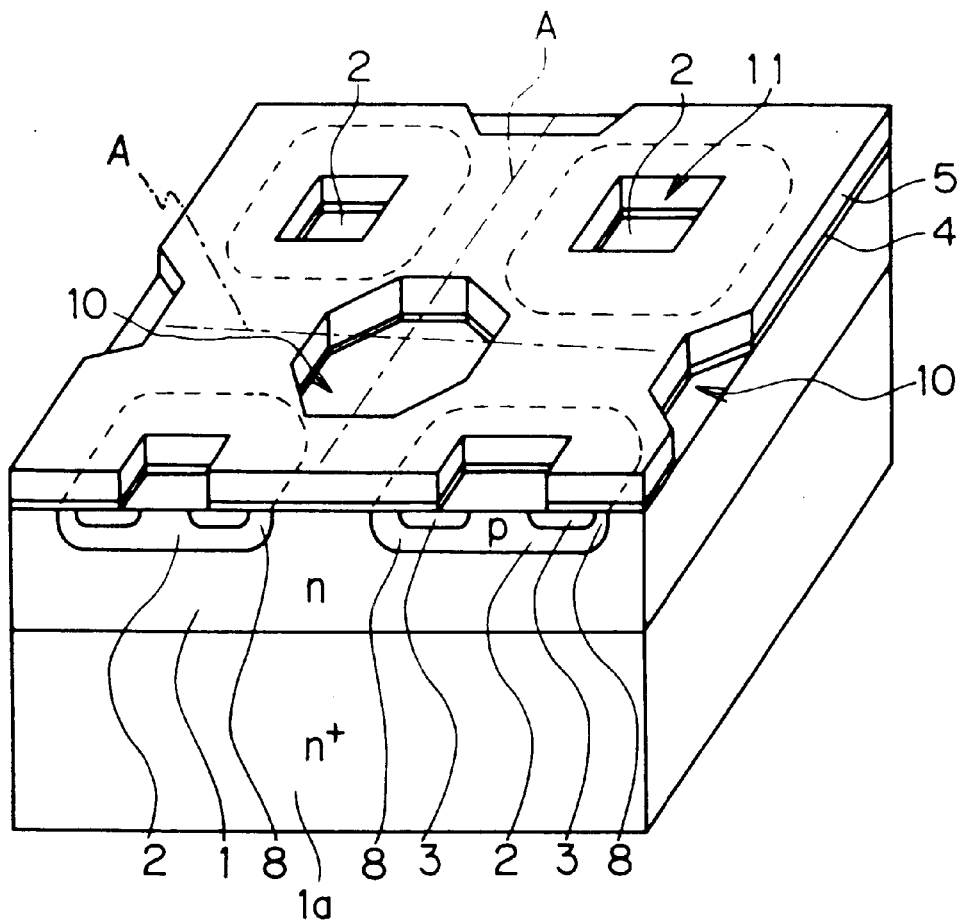
FIG. 1 is a perspective view with a partial section view of a vertical MOSFET which is one embodiment of an insulated gate type semiconductor device according to the present invention.

A vertical MOSFET which is one embodiment of an insulated gate type semiconductor device according.to the present invention is shown in FIG. 1. As shown in FIG. 1, on the surface of a first conductivity type (for example, n-type) semiconductor layer which will work as a drain region 1, a plurality of second conductivity type (p-type) diffusion regions (body regions) 2 are formed regularly. On the surface of each of the plurality of body regions 2, an n-type diffusion region is formed to be a source region 3. A channel region 8 is formed on the surface of the body region 2 between the source region 3 and the n-type semiconductor layer 1. As a result, a plurality of transistor cells (hereinafter, referred to simply as cells) are formed regularly (broken lines A indicate border lines between the cells). On the surface of this channel region 8, gate electrode 5 is provided through an insulator film 4 intervened in-between. In this gate electrode 5, removed portions 10 are formed in a certain shape by partially removing the gate electrode 5 in portions above the corners where adjoining four of the cells are bordering on each other without including any part of the channel regions 8. The numeral 11 represents source contact parts.

The semiconductor layer for the drain region 1 is formed as an epitaxial growth layer of n-type semiconductor on the $n^+$-type semiconductor substrate 1a. A metal film made of Ni, Au or the like is provided on the back side of the semiconductor substrate 1a (not shown) to form a drain electrode, and on the top side, an insulator film is provided, which is not shown. The insulator film is partially removed to form a source contact parts 11, on which source electrodes which is not shown are formed by vapor deposition of Al or the like to form a vertical MOSFET.

As shown in FIG. 1, the present invention is characterized by the gate electrode 5 made of a polysilicon film or the like, which is partially removed not only for the source contact parts 11 but also in the portions facing four adjoining body regions 12. That is to say, the removed portions 10 are formed above where adjoining four of the cells are bordering on each other so that they don't overlap any parts of the channel regions 8. Those removed portions 10 are to reduce capacitance generated between the gate electrode 5 and the drain region 1. Only to reduce the capacitance, the gate electrode could be removed anywhere except above the channel regions 8, however, in the present invention which contrives a way of not increasing the gate resistance, the removed portions 10 are formed in a pattern where they are located to be most remote from any of the channel regions of the transistor cells, that is to say, the removed portions are above where a corner of each cell is bordering on that of other cells and are spaced substantially equally from all of the body regions adjoining each other beneath each of the removed portions. That is to say, as shown in FIG. 1, in case a plurality of the body regions 2 (and the cells) are formed at regular intervals in a matrix, the corners of four adjoining cells are most remote from the channel regions, hence, the removed portions are formed above those parts in a shape of, for example, the equilateral octagon in the plane. Therefore the removed portions don't overlap any parts of the channel regions 8 nor have an extremely narrow part of the gap between the removed portions and the channel region or the source contact portion 11 of each cell. The gate resistance won't increase for any cells so that the signals are transmitted equally to any cells.

Figure 2:
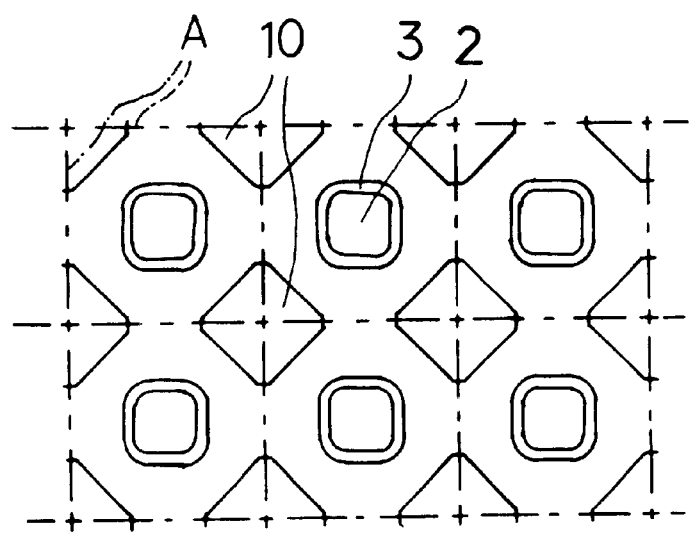
FIG. 2 is a view showing another structural example of the gate electrode with a different pattern of removed portions from that of FIG. 1.

The plane shape of said removed portions 10 is not limited to the equilateral octagon. That is to say, as shown in FIG. 2, it could be any other polygon shape such as a diamond shape of which corners are not overlapped with the channel regions 8. In this case as shown in FIG. 2, vertexes of the diamond shape removed portions 10 are cut off to be chamfered.

Figure 3A:
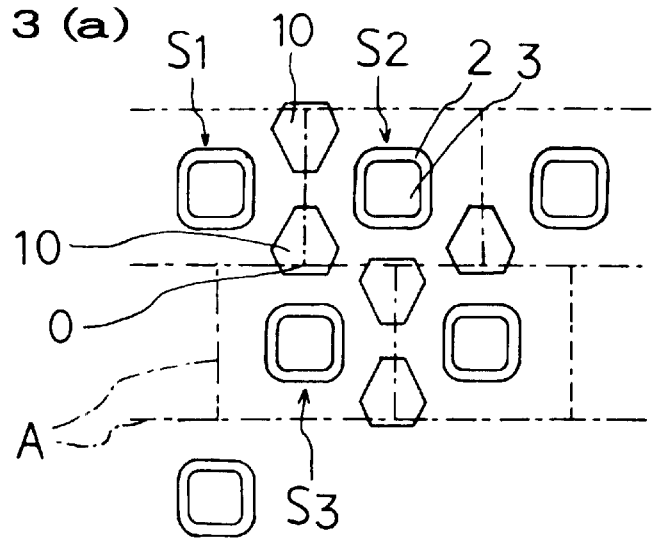
FIGS. 3(a) to 3(c) are views of yet other structural examples of the cell arrangement and the gate electrode with a pattern of removed portions;.
Figure 3B:
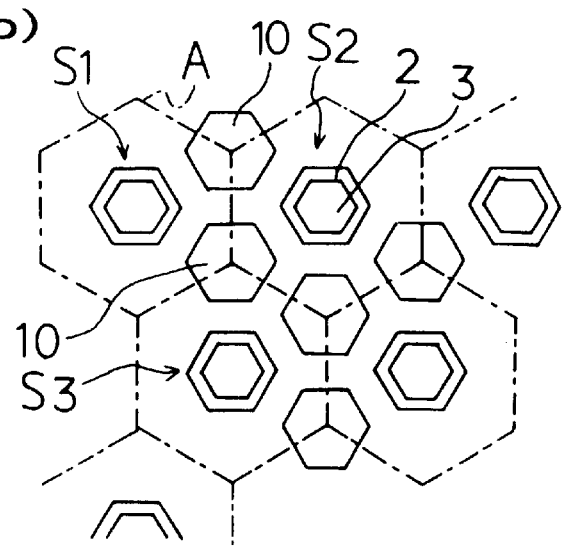
Figure 3C:
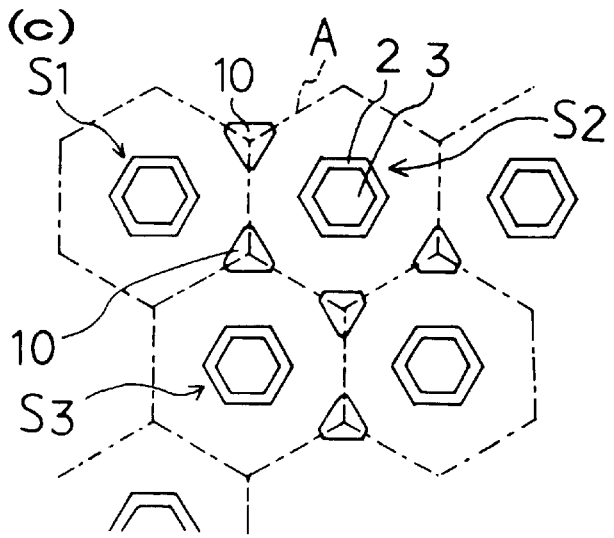
Figure 4:
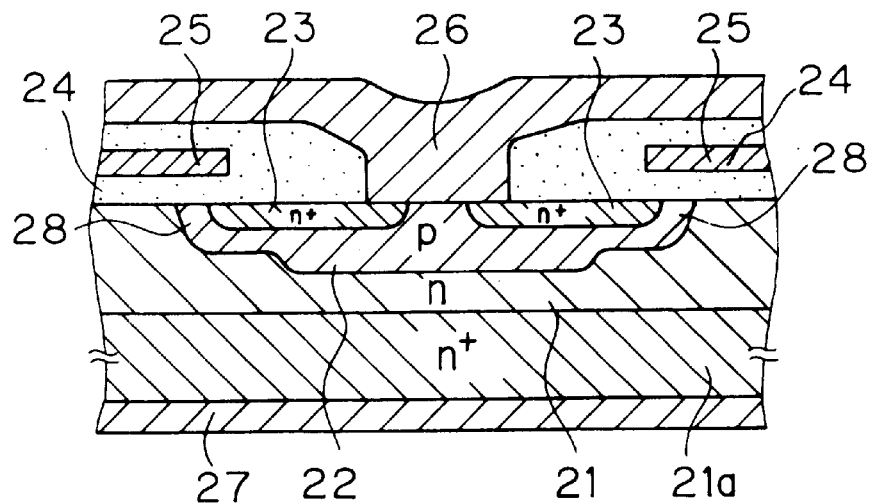
FIGS. 4(a) to 4(b) are section and plan views of a part of the conventional MOSFET.
Figure 4:
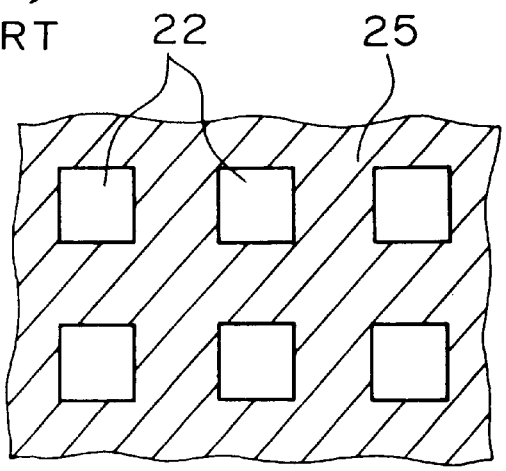
Figure 5:
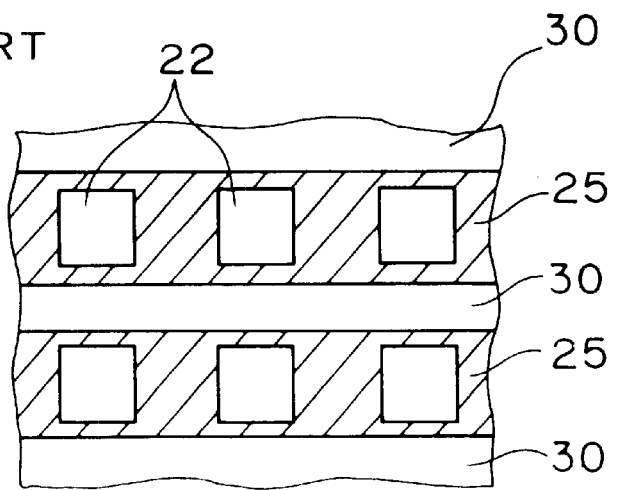
FIG. 5 is a explanatory view of an example for reducing the gate capacitance of a vertical MOSFET according to a prior art.

Though in the example shown in FIG. 1, the arrangement of the body regions 2 (the cells) are in a matrix where both columns and rows are arranged regularly, every other row could be shifted by half a pitch in the arrangement of the body regions 2 (the cells) for a higher density of the transistor cells, as shown in FIGS. 3(a) to 3(c), by referring to borderlines A of the body regions 2 and the cells. This structure is more preferable for a better property as a device, and an effective shape for the removed portions 10 for such an arrangement of the cells is shown in FIGS. 3(a) to 3(c).

In an example shown in FIG. 3(a), the body regions 2 are a quadrilateral in the plane (the corners are rounded into arcs) of which array is formed so that every other row in the array is shifted by half a pitch. Therefore borderlines A for each of the cells figures a quadrilateral similar to that of the body regions 2, every other row of which is shifted by half a pitch in array. In case of such an arrangement of the cells, as shown in FIG. 3(a), a point O is a common corner for two adjoining cells S1 and S2 in the same row and is on a side of the cell S3 in the next row. The removed portions 10 are formed above the point O. In this structure, the common corner O for two adjoining cells S1 and S2 maintains the largest distance from either channel region without influencing the operation of those cells. The removed portions above the point O outline a triangle (strictly speaking, it is a hexagon with the vertexes of the triangle being cut off and trapezoids with the same length of bases are attached on the bottom) so that the area of the removed portions 10 of the gate electrode 5 is maintained as large as possible without shifting too much into the cell S3 bordering on the side in the next row. Such a combination of the cell arrangement and the shape of the removed portions 10 provides the best performance of the switching characteristics or the like. It is preferable for the removed portions 10 to be provided independently over each of the borders of all the adjoining cells without a connection between the adjoining removed portions 10, which won't separate the gate electrode 5 between the adjoining cells. That is to say, it is preferable for parts of the gate electrode 5 for each of the adjoining cells to be connected mutually to lower the gate resistance.

In the examples shown in FIGS. 3(b)–3(c), every other row of cells in array are shifted by half a pitch, the body regions 2 are formed in the equilateral hexagon, and borderlines A dividing the array into the cells so that the distance is equal from each body region 2 between the bordering cells depicts a hexagon with angles corresponding to respective sides of the body region 2. In case of such an arrangement of the cells, removed portions 10 are provided above the portions where the angles of three adjoining cells are bordering on each other. In addition, a removed portion 10 spreads over the same area for each cell. FIG. 3(b) shows an example with removed portions 10 formed in the equilateral hexagon shape. FIG. 3(c) shows an example with removed portions 10 being formed in the equilateral triangle shape (in this figure, the vertexes are cut off). In this way, when the removed portions 10 are formed above the portions which adjoining cells are bordering, and with the same area equally spreading over each cell, the parts of the gate electrode 5 for adjoining cells S1, S2 and S3 are connected to lower the gate resistance, and it contributes to speeding up the switching speed with a reduced gate capacitance.

To form such removed portions 10, a polysilicon film is formed as the gate electrode 5, and then patterned with a mask, and the polysilicon film is etched in portions not above the channel regions 8. At this time, the polysilicon film could be etched for source contact parts 11 and then an interlayer isolation such as $SiO_2$ film is formed by CVD or the like and the insulator film is removed only for the source contact parts 11 to expose the source regions 3 together with the cores of the body regions 2 to form source electrodes not shown in the figure as mentioned above.

According to the vertical MOSFET of the present invention, the capacitance between the gate electrode 5 and the drain region 1 is greatly reduced because the gate electrode (gate lines) 5 are removed partially through etching. As a result, the total charge $Q_g$ over the entire gate could be lowered to improve the switching speed greatly. On the other hands, all parts of the gate electrode above the channel regions of the respective cells are connected to each other between all adjoining cells without increasing the gate resistance. As a result, signals to the gate electrode for each cell is transmitted without a delay for the device operation of a high performance.

Though the above mentioned examples are all in regard to a vertical MOSFET, the present invention should not be limited to a vertical MOSFET, rather it could be applied in the same way for any semiconductor devices with an insulated gate such as an insulated gate type bipolar transistor.

As described above, according to the present invention, an insulated gate type semiconductor device can be provided for a high performance such as a speedy switching speed due to a reduced gate capacitance without increasing the gate resistance.

Although preferred example have been described in some detail it is to be understood that certain changes can be made by those skilled in the art without departing from the spirit and scope of the invention as defined by the appended claims.

What is claimed is:

1. An insulated gate type semiconductor device comprising:

a plurality of transistor cells, each of which comprising; a first conductivity type semiconductor layer, a body region comprising a second conductivity type diffusion region provided on a surface of said semiconductor layer, said body region being formed in a quadrilateral form, a first conductivity type diffusion region formed on the surface of said body region, a channel region formed on the surface of said body region between said first conductivity type diffusion region and said first conductivity type semiconductor layer, said plurality of transistor cells being arranged in a matrix to adjoin one corner of four of said plurality of transistor cells, and a gate electrode provided on the surface of said semiconductor layer via an insulator film so as to cover at least the surface of said channel regions, said gate electrode being patterned with removed portions to have a certain shape, the removed portions being formed above where adjoining four transistor cells are bordering on each other, without including any part of said channel regions.

2. The semiconductor device of claim 1, wherein a shape of said portions where said gate electrode is removed is a quadrilateral or an octagon.

3. The semiconductor device according to claim 1, wherein said removed portions provided above where said adjoining transistor cells are bordering on each other are respectively isolated without connecting to each other.

* * * * *